US00RE42334E

(19) United States
(12) Reissued Patent
Miyagi

(10) Patent Number: US RE42,334 E
(45) Date of Reissued Patent: May 10, 2011

(54) SMOOTHING CIRCUIT EMPLOYING CHARGING CIRCUIT INTERMITTENTLY CHARGING WHEN INPUT VOLTAGE IS HIGHER RELATIVELY THAN TERMINAL VOLTAGE AND DISCHARGING CIRCUIT INTERMITTENTLY RELEASING DISCHARGING CURRENT WHEN TERMINAL VOLTAGE IS HIGHER RELATIVELY THAN INPUT VOLTAGE

(75) Inventor: Hiroshi Miyagi, Yokohama (JP)

(73) Assignee: Ricoh Company, Ltd., Tokyo (JP)

(21) Appl. No.: 11/779,229

(22) PCT Filed: Dec. 20, 2001

(86) PCT No.: PCT/JP01/11184

§ 371 (c)(1),
(2), (4) Date: Jun. 11, 2003

(87) PCT Pub. No.: WO02/51005

PCT Pub. Date: Jun. 27, 2002

Related U.S. Patent Documents

Reissue of:
(64) Patent No.: 6,919,710
Issued: Jul. 19, 2005
Appl. No.: 10/450,428
Filed: Jun. 11, 2003

(30) Foreign Application Priority Data

Dec. 21, 2000 (JP) ..... 2000-388815
Jun. 29, 2001 (JP) ..... 2001-198217

(51) Int. Cl.
*H01M 10/46* (2006.01)

(52) U.S. Cl. ..... 320/133

(58) Field of Classification Search ..... 320/127, 320/128, 133, 135, 137, 166, 167; 307/105, 307/109, 110; 330/141, 281
See application file for complete search history.

(56) References Cited

U.S. PATENT DOCUMENTS

| | | | | |
|---|---|---|---|---|
| 3,761,795 | A | 9/1973 | Clayton et al. | |
| 5,619,107 | A | 4/1997 | Shinohara et al. | |
| 6,844,780 | B1 * | 1/2005 | Miyagi | 330/141 |

FOREIGN PATENT DOCUMENTS

| | | | |
|---|---|---|---|
| JP | S54-81545 | A | 6/1979 |
| JP | 57-192120 | | 11/1982 |
| JP | H01-13648 | B | 3/1989 |
| JP | 7-22880 | | 1/1995 |
| JP | H10-303701 | A | 11/1998 |

* cited by examiner

*Primary Examiner* — Edward Tso
(74) *Attorney, Agent, or Firm* — patenttm.us

(57) ABSTRACT

A smoothing circuit for realizing the miniaturization and the increase of integration scale of a circuit and for easily varying attack time and release time. This smoothing circuit comprises a capacitor, voltage comparator, charging circuit, and discharging circuit. The voltage comparator compares the terminal voltage of the capacitor with its input voltage and actuates the charging circuit or the discharging circuit according to a comparison result. The charging circuit charges the capacitor by intermittently supplying charging current. The discharging circuit discharges the capacitor by allowing discharging current to flow intermittently.

14 Claims, 6 Drawing Sheets

SMOOTHING CIRCUIT EMPLOYING CHARGING CIRCUIT INTERMITTENTLY CHARGING WHEN INPUT VOLTAGE IS HIGHER RELATIVELY THAN TERMINAL VOLTAGE AND DISCHARGING CIRCUIT INTERMITTENTLY RELEASING DISCHARGING CURRENT WHEN TERMINAL VOLTAGE IS HIGHER RELATIVELY THAN INPUT VOLTAGE

Matter enclosed in heavy brackets [ ] appears in the original patent but forms no part of this reissue specification; matter printed in italics indicates the additions made by reissue.

BACKGROUND OF THE INVENTION

1. Field of the Invention

The present invention relates to a smoothing circuit used in an AGC (automatic gain control) circuit or the like for a receiver.

2. Description of the Related Art

An AGC circuit is used for control of the input signal level in AM receivers, FM receivers, and the like. In this AGC circuit, a signal is formed which changes gradually so as to follow a change in signal level when the signal level changes, and a smoothing circuit is used to form such a signal.

FIG. 8 is a circuit diagram showing the configuration of a conventional smoothing circuit. The smoothing circuit shown in FIG. 8 is formed by combining two resistors 100 and 102 and a capacitor 104. When an input voltage is applied to one end of the resistor 100, a charging current flows into the capacitor 104 through the resistor 100 and the terminal voltage of the capacitor 104 is thereby increased. If the resistance value of the resistor 100 is R1 and the electrostatic capacity of the capacitor 104 is C, time t1 during which the terminal voltage of the capacitor 104 increases to a predetermined value can be expressed by R1×C. This time t1 is an attack time. Time t1 is set to about 10 to 50 msec in a smoothing circuit used in an AGC circuit for a receiver or the like.

When application of the input voltage to the one end of the resistor 100 is stopped, the capacitor 104 is discharged through the resistor 102 and the terminal voltage of the capacitor 104 is thereby reduced. If the resistance value of the resistor 102 is R2, time t2 during which the terminal voltage of the capacitor 104 decreases to a predetermined value can be expressed by R2×C. This time t2 is a release time. Time t2 is set to about 200 to 500 msec in a smoothing circuit used in an AGC circuit for a receiver or the like.

The above-described conventional smoothing circuit has a problem that in the case of realizing an attack time of about 10 to 50 msec and a release time of about 200 to 500 msec, the device constant of each of the resistors 100 and 102 and the capacitor 104 is so increased that it is difficult to limit the size of the circuit or to form the circuit in an IC, because it is necessary to set a large time constant in each of the combination of the resistor 100 and the capacitor 104 and the combination of the resistor 102 and the capacitor 104. For example, in the case of formation in an IC, the resistance value of the resistor actually formable is at most about 500 kΩ. If such a resistor is used and if the release time t2 is set to 100 msec, C=t2/R2=0.2 μF. However, the electrostatic capacity of a capacitor in an IC according to a design considering the manufacturing cost, etc., is 20 pF or less. After all, it is difficult to form the entire smoothing circuit in an IC, and the capacitor heretofore used is an externally-mounted large capacitor.

SUMMARY OF THE INVENTION

The present invention has been created in consideration of the above-described points, and an object of the present invention is to provide a smoothing circuit which can be reduced in size and formed in an IC.

Another object of the present invention is to provide a smoothing circuit in which the attack time and the release time can be easily set to different lengths of time.

A smoothing circuit in accordance with the present invention has a capacitor, a voltage comparator which compares a terminal voltage of the capacitor and an input voltage, a charging circuit which intermittently charges the capacitor when the input voltage is relatively higher than the terminal voltage, and a discharging circuit which intermittently releases a discharging current from the capacitor when the terminal voltage is relatively [lower] *higher* than the input voltage. Since the capacitor is intermittently charged and discharged, the terminal voltage of the capacitor changes gradually and an equivalently large time constant can be set even if the electrostatic capacity of the capacitor is reduced. Therefore, even in the case of setting a large time constant, a smaller capacitor can be used and the size of the circuit can be reduced. The need for a large resistor and a large capacitor necessary for setting a large time constant is eliminated to make it possible to reduce or completely remove externally mounted component parts. Therefore, the entire smoothing circuit or almost all the components parts can be formed in an IC.

It is desirable that the above-described charging circuit comprises a current supply section which supplies a predetermined charging current to the capacitor, and a first timing control section which controls the timing of the operation to intermittently supply the charging current by the current supply section. The operation to intermittently charge the capacitor can be easily controlled by controlling the timing of the operation to supply the charging current by the current supply section.

It is desirable that the above-described first timing control section has a switch for performing the timing control on the basis of a pulse signal having a predetermined duty ratio. The operation to supply the charging current by the current supply section is controlled by turning on and off the switch according to the pulse signal, thereby enabling the charging speed or the like to be easily changed by changing the period or the duty ratio of the pulse signal.

It is desirable that the above-described current supply section comprises a constant-current circuit and a current mirror circuit which supplies the capacitor with the charging current equal to the current generated by the constant-current circuit. Use of the current mirror circuit makes it possible to reliably supply the capacitor with the charging current equal to the constant current generated by the constant-current circuit and to stabilize the capacitor charging operation.

It is desirable that the above-described discharging circuit comprises a current release section which releases the predetermined discharging current from the capacitor, and a second timing control section which controls the timing of the operation to intermittently release the discharging current by the current release section. The operation to intermittently discharge the capacitor can be easily controlled by controlling the timing of the operation to release the discharging current by the current release section.

It is desirable that the above-described second timing control section comprises a switch for performing the timing control on the basis of a pulse signal having a predetermined duty ratio. The operation to release the discharging current by the current release section is controlled by turning on and off the switch according to the pulse signal, thereby enabling the discharging speed or the like to be easily changed by changing the period or the duty ratio of the pulse signal.

It is desirable that the above-described current release section comprises a constant-current circuit and a current mirror circuit which releases from the capacitor the discharging current equal to the current generated by the constant-current circuit. Use of the current mirror circuit makes it possible to reliably release the discharging current equal to the constant current generated by the constant-current circuit from the capacitor and to stabilize the capacitor discharging operation.

In a case where the charging circuit comprises a current supply section which supplies a predetermined charging current to the capacitor, and a first timing control section which controls the timing of the operation to intermittently supply the charging current by the current supply section, and where the discharging circuit comprises a current release section which releases the predetermined discharging current from the capacitor, and a second timing control section which controls the timing of the operation to intermittently release the discharging current by the current release section, it is desirable that the timing of supply of the charging current controlled by the first timing control section and the timing of discharging by the discharging current controlled by the second timing control section do not overlap each other. The timings of charging and discharging of the capacitor are made different from each other to enable the operation to charge the capacitor and the operation to discharge the capacitor to be performed with reliability.

It is desirable that the smoothing circuit further comprises charging/discharging speed setting unit for setting the speed of charging by the charging circuit and the speed of discharging by the discharging circuit to different values. If the charging/discharging speed setting unit is provided, the speed of charging of the capacitor and the speed of discharging of the capacitor can b set different from each other, thus making it possible to easily realize a smoothing circuit in which the attack time and release time can easily be set to different lengths of time.

It is desirable that the charging circuit comprises a current supply section which supplies a predetermined charging current to the capacitor, and a first timing control section which controls the timing of the operation to intermittently supply the charging current by the current supply section; the discharging circuit comprise a current release section which releases the predetermined discharging current from the capacitor, and a second timing control section which controls the timing of the operation to intermittently release the discharging current by the current release section; and the timings of intermittent supply of the charging current and intermittent release of the discharging current by the first and second timing control sections be made different from each other by the charging/discharging speed setting unit. The operation to intermittently discharge the capacitor can easily be controlled by controlling the timing of the operation to supply the charging current by the current supply section and the timing of the operation to release the discharging current by the current release section. Moreover, the attack time and the release time can easily be set to different lengths of time by setting the time periods for charging and discharging different from each other.

In the case where each of the first and second timing control sections has a switch for performing timing control on the basis of a pulse signal having a predetermined duty ratio, it is desirable that the above-described charging/discharging speed setting unit sets the duty ratio of the pulse signal for charging and the duty ratio of the pulse signal for discharging to different values. The control for setting the charging time and the discharging time to different lengths of time is thereby facilitated.

It is desirable that the charging/discharging speed setting unit sets the charging current supplied by the current supply section and the discharging current released by the current release section to different values. The attack time and the release time can easily be set to different lengths of time by setting the charging current and the discharging current to different values.

In a case where each of the current supply section and the current release section is constituted by a transistor having a predetermined reference voltage applied to its gate, it is desirable that the charging/discharging speed setting unit makes the gate size of the transistor for charging and the gate size of the transistor for discharging different from each other. The control for setting the charging current and the discharging current to different values is thereby facilitated.

It is desirable that the frequency of the pulse signal for setting the above-described charging and discharging timings be higher than twice the frequency of the input signal. Accurate sampling of the waveform of the input signal can be ensured by setting the frequency of the pulse signals higher than twice the frequency of the input signal. If the frequency of the pulse signals is set to twice the frequency of the input signal, coincidence with the time at which the amplitude of the input signal becomes zero may occur to cause failure to perform the operation on the basis of the waveform of the input signal. If the frequency of the pulse signals is set lower than twice the frequency of the input signal, there is a possibility of no pulse signal being output during the half-wavelength period of the waveform of the input signal, resulting in failure to perform the smoothing operation with accuracy on the basis of the waveform of the input signal.

DETAILED DESCRIPTION OF THE PREFERRED EMBODIMENTS

A smoothing circuit to which the present invention is applied according to an embodiment of the present invention will be described with reference to the drawings.

(First Embodiment)

Figure 1:
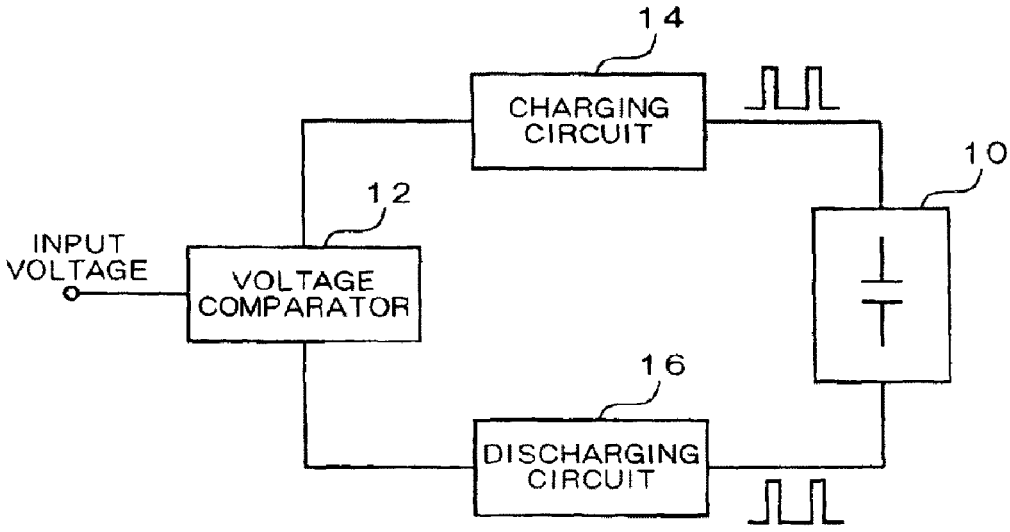
FIG. 1 is a block diagram of the principle of a smoothing circuit in a first embodiment.

FIG. 1 is a block diagram of the principle of a smoothing circuit in a first embodiment of the present invention. As shown in FIG. 1, the smoothing circuit of this embodiment has a capacitor 10, a voltage comparator 12, a charging circuit 14, and a discharging circuit 16. The voltage comparator 12 compares a terminal voltage of the capacitor 10 and an input voltage with each other and makes effective the operation of the charging circuit 14 or the discharging circuit 16 according to the result of this comparison. The charging circuit 14 charges the capacitor 10 by intermittently supplying a charging current. For example, this charging circuit 14 comprises a constant-current circuit and a switch. When the switch becomes ON, the charging current is supplied from the constant-current circuit to the capacitor 10. The discharging circuit 16 discharges the capacitor 10 by causing a discharging current to flow intermittently. For example, this discharging circuit 16 comprises a constant-current circuit and a switch. When the switch becomes ON, a constant current is released from the capacitor 10.

Thus, the smoothing circuit of this embodiment performs intermittent charging and discharging operations on the capacitor 10. Therefore, even in a case where the electrostatic capacity of the capacitor 10 is set small, the opposite-terminal voltage of the capacitor 10 changes gradually and charging and discharging characteristics can be obtained which are equivalent to those obtained in the case of use of a circuit having a large time constant, i.e., a capacitor having a large electrostatic capacity and a resistor having a large resistance value. The charging circuit 14 and the discharging circuit 16, which control supply of the predetermined current to the capacitor 10 and release of the predetermined current from the capacitor 10, are capable of setting the current values to substantially large values suitable for formation in an IC because they perform supply and release operations intermittently. Therefore the entire smoothing circuit can be formed in an IC. Since the need for an externally mounted component such as a capacitor is eliminated, the overall size of the smoothing circuit can be effectively reduced.

A concrete example of the configuration of the above-described smoothing circuit of this embodiment and an example of application of the smoothing circuit will next be described.

Figure 2:
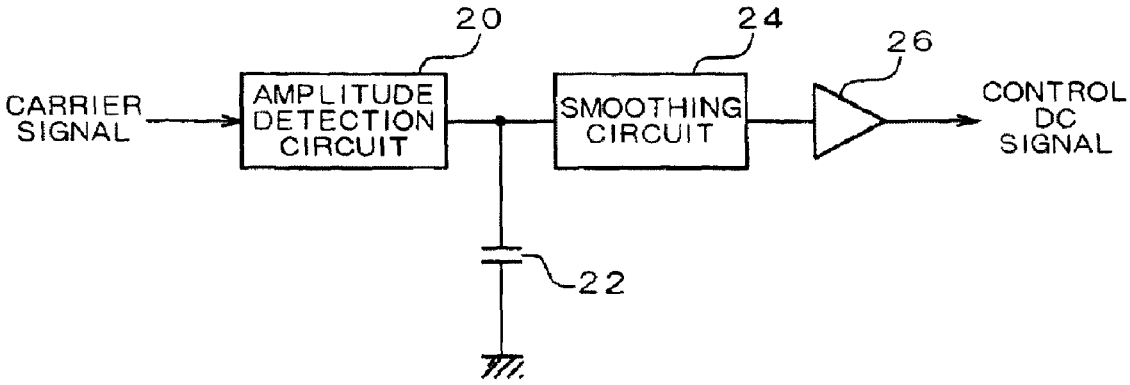
FIG. 2 is a configuration diagram showing an example of use of a smoothing circuit included in an AGC circuit.

FIG. 2 is a configuration diagram showing an example of use of a smoothing circuit included in an AGC circuit. FIG. 2 shows part of the configuration of an AGC circuit which performs gain control in a receiver according to the intensity of an electric field. The receiver may be a direct-conversion receiver, a superheterodyne receiver or the like.

Referring to FIG. 2, an amplitude detection circuit 20 is supplied with a carrier signal in the receiver and performs half-wave or full-wave rectification on the input carrier signal. A capacitor 22 is for removing the carrier portion of the signal after rectification by the amplitude detection circuit 20. If the carrier portion is removed by the capacitor 22, and if the carrier is not amplitude modulated, a direct current voltage can be obtained and, therefore, a smoothing circuit 24 in a following stage is unnecessary. However, AM waves and even FM waves have some amplitude change and the smoothing circuit 24 is required if it is necessary to detect the intensity of the received electric field.

The smoothing circuit 24 smoothes the voltage level of a signal from which the carrier portion has been removed by the capacitor 22. The smoothed voltage is applied to a buffer 26 having a high input impedance. A control DC signal necessary for AGC operation is output from this buffer 26.

Figure 3:
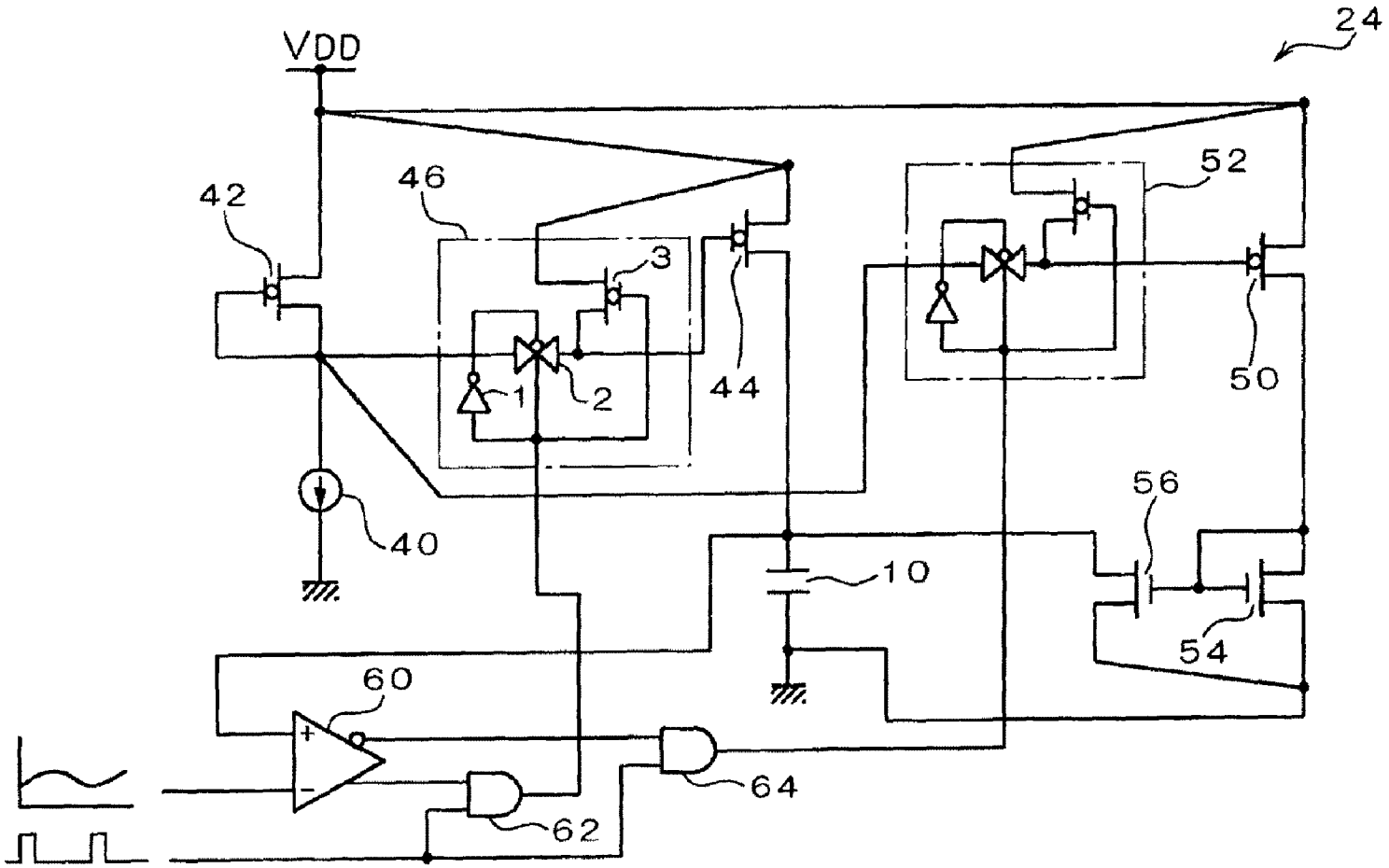
FIG. 3 is a circuit diagram showing a concrete configuration of the smoothing circuit.

FIG. 3 is a circuit diagram showing a concrete example of a configuration of the smoothing circuit 24. As shown in FIG. 3, the smoothing circuit 24 comprises a capacitor 10, a constant-current circuit 40, transistors 42, 44, 50, 54, and 56, switches 46 and 52, a voltage comparator 60, and AND circuits 62 and 64.

Two transistors 42 and 44 constitute a current mirror circuit to generate a charging current equal to a constant current output from the constant-current circuit 40. The timing of generation of this charging current is determined by the switch 46.

The switch 46 is constituted by an inverter circuit 1, an analog switch 2, and a transistor 3. The analog switch 2 is formed by connecting a p-channel transistor and an n-channel transistor between their sources and drains in parallel. An output signal from the AND circuit 62 is directly input to the gate of the n-channel transistor, while a signal obtained by inverting the logic of this output signal by the inverter circuit 1 is input to the gate of the p-channel transistor. Therefore this analog switch 2 is on when the output signal from the AND circuit 62 is high level, and is off when the output signal from the AND circuit 62 is low level. The transistor 3 is for establishing a low-resistance connection between the gate and the drain of the transistor 44 when the analog switch 2 is off. A current supply operation with the transistor 44 is thereby stopped with reliability.

When the switch 46 becomes on, the gate of the transistor 42 on one side to which the constant-current circuit 40 is connected and the gate of the transistor 44 on the other side are in a state of being connected to each other. In this state, therefore, a current which is substantially the same as a constant current generated by the constant-current circuit 40 connected to the transistor 42 on one side is also caused to flow through the path between the source and drain of the transistor 44 on the other side. This current is supplied as a charging current to the capacitor 10. Conversely, when the switch 46 becomes off, the gate of the transistor 44 is connected to the drain to stop supplying the charging current.

The above-described constant-current circuit 40 and two transistors 42 and 44 correspond to the current supply section. The switch 46 and the AND circuit 62 correspond to the first timing control section.

The current mirror circuit with which a discharging current to the capacitor 10 is set is formed by combining a transistor 50 with the above-described transistor 42 and constant-current circuit 40, and the operating state of the current mirror circuit is determined by the switch 52. The switch 52 has the same configuration as that of the switch 46. The on/off state of the switch 52 is controlled according to the logic of an output signal from the AND circuit 64. The switch 52 is in the on state when this output signal is high level, and in the off state when this output signal is low level.

When the switch 52 is in the on state, the gate of the transistor 42 on one side to which the constant-current circuit 40 is connected and the gate of the transistor 50 on the other side are in a state of being connected to each other. In this state, therefore, a current which is substantially the same as the constant current generated by the constant-current circuit 40 is also caused to flow through the path between the source and drain of the transistor 50 on the other side. This current is a discharging current by which charge accumulated in the capacitor 10 is released.

However, the current flowing through the transistor 50 cannot be extracted directly from the capacitor 10. In this embodiment, therefore, another current mirror circuit constituted by transistors 54 and 56 is connected on the source side of the transistor 50.

The two transistors 54 and 56 have their gates connected to each other. When the above-described discharging current flows through the transistor 54, the same current also flows through the path between the source and the drain of the other transistor 56. This transistor 56 has its drain connected to the terminal of the capacitor 10 on the high-potential side and the current flowing through the transistor 56 is generated by release of charge accumulated in the capacitor 10.

The above-described constant-current circuit 40 and the four transistors 42, 50, 54, and 56 correspond to the current release section. The switch 52 and the AND circuit 64 correspond to the second timing control section.

The voltage comparator 60 compares the magnitude of the terminal voltage of the capacitor 10 applied to its plus terminal and the magnitude of the input voltage of the smoothing circuit 24 applied to its minus terminal. The voltage comparator 60 has a noninverting output terminal and an inverting output terminal. When the terminal voltage of the capacitor 10 applied to the plus terminal is higher than the input voltage applied to the minus terminal, the voltage comparator 60 outputs a high-level signal through the noninverting output terminal and outputs a low-level signal through the inverting output terminal. Conversely, when the terminal voltage of the capacitor 10 applied to the plus terminal is lower than the input voltage applied to the minus terminal, the voltage comparator 60 outputs a low-level signal through the noninverting output terminal and outputs a high-level signal through the inverting output terminal.

A predetermined pulse signal is input to the AND circuit 62 through one of two input terminals of the AND circuit 62, and the noninverting output terminal of the voltage comparator 60 is connected to the other of the input terminals of the AND circuit 62. Therefore the predetermined pulse signal is output from the AND circuit 62 when the terminal voltage of the capacitor 10 is higher than the input voltage of the smoothing circuit 24.

Also, a predetermined pulse signal is input to the AND circuit 64 through one of two input terminals of the AND circuit 64, and the inverting output terminal of the voltage comparator 60 is connected to the other of the input terminals of the AND circuit 64. Therefore the predetermined pulse signal is output from the AND circuit 64 when the terminal voltage of the capacitor 10 is lower than the input voltage of the smoothing circuit 24.

Also, a predetermined pulse signal is input to the AND circuit 64 through one of two input terminals of the AND circuit 64, and the inverting input terminal of the voltage comparator 60 is connected to the other of the input terminals of the AND circuit 64. Therefore the predetermined pulse signal is output from the AND circuit 64 when the terminal voltage of the capacitor 10 is lower than the input voltage of the smoothing circuit 24.

The smoothing circuit 24 is thus arranged. The operation of the smoothing circuit 24 will next be described.

In the case where the capacitor 10 is not in a charged state or the input voltage of the smoothing circuit 24 is increasing when the smoothing circuit 24 starts operating, the terminal voltage of the capacitor 10 is lower than the input voltage of the smoothing circuit 24. In this state, the pulse signal is output from the AND circuit 62, while no pulse signal is output from the AND circuit 64. Accordingly, only the switch 46 is intermittently set in the on state. Each time the switch 46 is in the on state, the predetermined charging current is supplied to the capacitor 10. This charging operation is continued until the terminal voltage of the capacitor 10 becomes higher relatively than the input voltage of the smoothing circuit 24.

When the terminal voltage of the capacitor 10 exceeds the input voltage of the smoothing circuit 24 as a result of this charging operation, or when the input voltage is decreasing and lower than the terminal voltage of the capacitor 10, the pulse signal is output from the AND circuit 64, while no pulse signal is output from the AND circuit 62. Accordingly, only the switch 52 is intermittently set in the on state. Each time the switch 52 is in the on state, the predetermined discharging current is caused to flow out of the capacitor 10. This discharging operation is continued until the terminal voltage of the capacitor 10 becomes lower relatively than the input voltage of the smoothing circuit 24.

It is necessary that in the above-described smoothing circuit 24 the frequency of the pulse signals for setting the timings of charging and discharging of the capacitor 10 (the pulse signals output from the AND circuit 62 or 64) be set to a value higher than twice the frequency of the input signal input through the noninverting input terminal of the voltage comparator 60. This setting ensures that the smoothing operation can be performed by sampling the waveform of the input signal with accuracy. If the frequency of the pulse signals is set to twice the frequency of the input signal, coincidence with the time at which the amplitude of the input signal becomes zero may occur to cause failure to perform the operation on the basis of the waveform of the input signal. If the frequency of the pulse signals is set lower than twice the frequency of the input signal, there is a possibility of no pulse signal being output during the half-wavelength period of the waveform of the input signal, resulting in failure to perform the smoothing operation with accuracy on the basis of the waveform of the input signal.

It is also necessary to set the two kinds of pulse signal for setting the timings of charging and discharging of the capacitor 10 so that the output timings do not overlap each other. By setting the timings of charging and discharging of the capacitor 10 different from each other, it is ensured that the operation to charge the capacitor 10 and the operation to discharge the capacitor 10 can be performed with reliability.

(Second Embodiment)

In the smoothing circuit 24 of which a concrete example of the configuration is shown in FIG. 3, the period and the duty ratio of the pulse signal for determining the timing of supply of the charging current and the period and the duty ratio of the pulse signal for determining the timing of supply of the discharging current are set equal to each other. However, they may differ from each other. For example, the duty ratio of the pulse signal input to the AND circuit 64 shown in FIG. 3 is set lower than the duty ratio of the pulse signal input to the AND circuit 62. In this manner, the release time can be set longer than the attack time.

Figure 4:
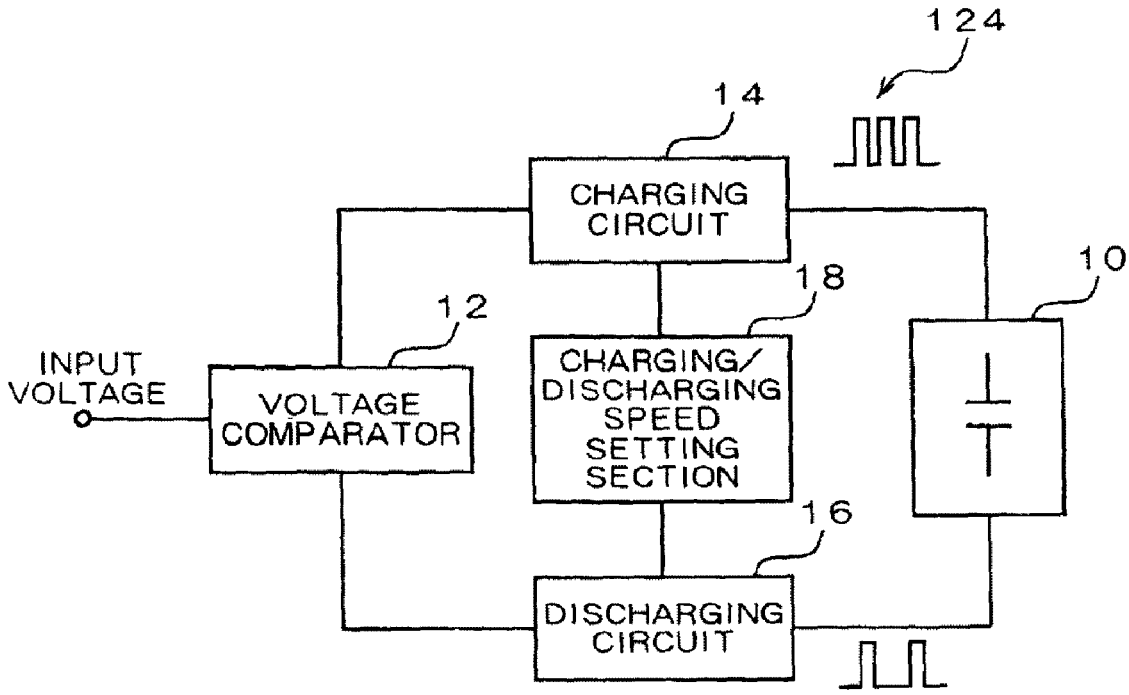
FIG. 4 is a block diagram of the principle of a smoothing circuit in a second embodiment.

FIG. 4 is a block diagram of the principle of a smoothing circuit in a second embodiment of the present invention. As shown in FIG. 4, a smoothing circuit 124 of this embodiment has a capacitor 10, a voltage comparator 12, a charging circuit 14, a discharging circuit 16, and a charging/discharging speed setting section 18. The smoothing circuit shown in FIG. 4 differs from the smoothing circuit of the first embodiment shown in FIG. 1 in that the charging/discharging speed setting section 18 is added.

The charging/discharging speed setting section 18 makes such a setting that the speed of charging of the capacitor 10 by the charging circuit 14 and the speed of discharging of the capacitor 10 by the discharging circuit 16 differ from each other. The charging/discharging speed setting section 18 corresponds to the charging/discharging speed setting unit. Detailed description of the charging/discharging speed setting section 18 will be made below.

In the smoothing circuit of this embodiment, the charging/discharging speed setting section 18 sets the speed of charging of the capacitor 10 and the speed of discharging of the capacitor 10 different from each other. Therefore the attack time and the release time in the case of use of this smoothing circuit in an AGC circuit or the like can be made different from each other.

Figure 5:
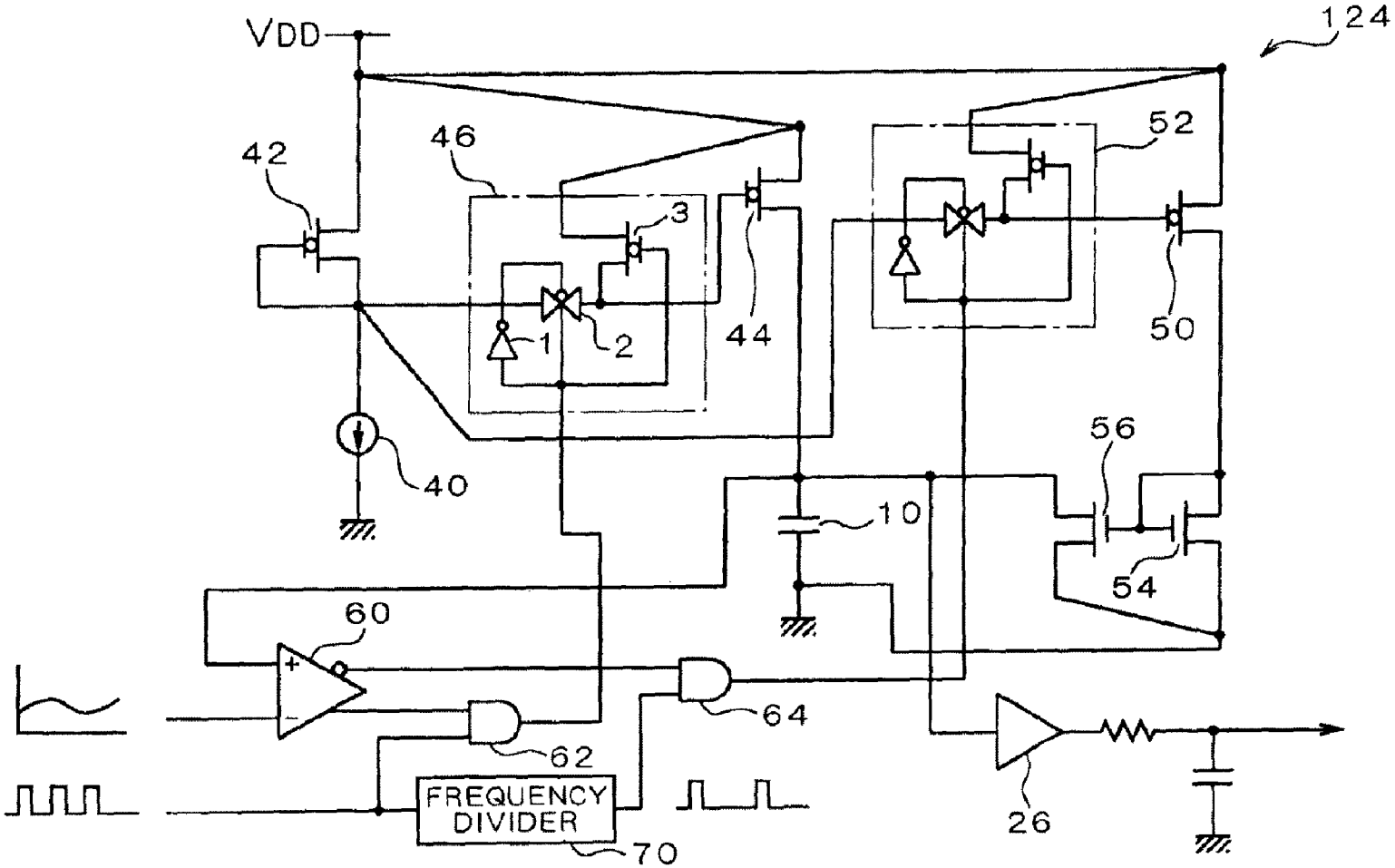
FIG. 5 is a circuit diagram showing a concrete configuration of the smoothing circuit.

FIG. 5 is a circuit diagram showing a concrete configuration of the smoothing circuit 124. As shown in FIG. 5, the smoothing circuit 124 comprises a capacitor 10, a constant-current circuit 40, transistors 42, 44, 50, 54, and 56, switches 46 and 52, a voltage comparator 60, AND circuits 62 and 64, and a frequency divider 70. The smoothing circuit 124 shown in FIG. 5 has such a configuration that the frequency divider 70 corresponding to the charging/discharging speed setting section 18 (charging/discharging speed setting unit) is added to the smoothing circuit 24 of the first embodiment shown in FIG. 3. Components basically the same as those in the smoothing circuit 24 shown in FIG. 3 are indicated by the same reference numerals, and detailed description of them will not be repeated.

The frequency divider 70 divides at a predetermined division ratio the frequency of the pulse signal input to the AND circuit 62 through one of the two input terminals of the AND circuit 62, and outputs the frequency-divided signal. The predetermined pulse signal output from the frequency divider 70 is input to the AND circuit 64 through one of two input terminals of the AND circuit 64, and the inverting output terminal of the voltage comparator 60 is connected to the other of the input terminals of the AND circuit 64, thereby enabling the predetermined pulse signal to be output from the AND circuit 64 when the terminal voltage of the capacitor 10 is lower than the input voltage of the smoothing circuit 124.

In two kinds of pulse signal output from the two AND circuits 62 and 64, the duty ratio of the pulse signal output from the AND circuit 62 is higher than the duty ratio of the pulse signal output from the AND circuit 64. Therefore, if pulse signals are respectively output from the two AND circuits 62 and 64 for the same time period, the speed of charging per unit time period is higher than that of discharging. Consequently, the attack time is shorter than the release time.

In this embodiment, only one of the two output terminals of the voltage comparator 60 is high level. Therefore there is no possibility of the pulse signals being simultaneously output from the two AND circuits 62 and 64, and the operation to charge or discharge the capacitor 10 can be performed with reliability and safety.

The present invention is not limited to the above-described embodiments, and various modifications can be made in the embodiments without departing from the scope of the gist of the present invention. For example, while in the above-described second embodiment the frequency divider 70 is used to output from the two AND circuits 62 and 64 pulse signals having duty ratios different from each other, pulse signals having different duty ratios may be separately formed and respectively input to the two AND circuits 62 and 64. However, it is necessary to avoid simultaneously inputting the two kinds of pulse signals separately generated to the two AND circuits 62 and 64. If there is a possibility of the pulse signals being simultaneously input, a blocking circuit for forcibly blocking input of one of the pulse signals may be provided.

In the above-described second embodiment, the proportions of the time periods in the unit time during which the transistors 44 and 50 are respectively set in the on states are set to different values in order to perform charging and discharging of the capacitor 10 at different speeds. Alternatively, the gale sizes of these transistors may be made different from each other to set the charging current and the discharging current to different values.

Figure 6:
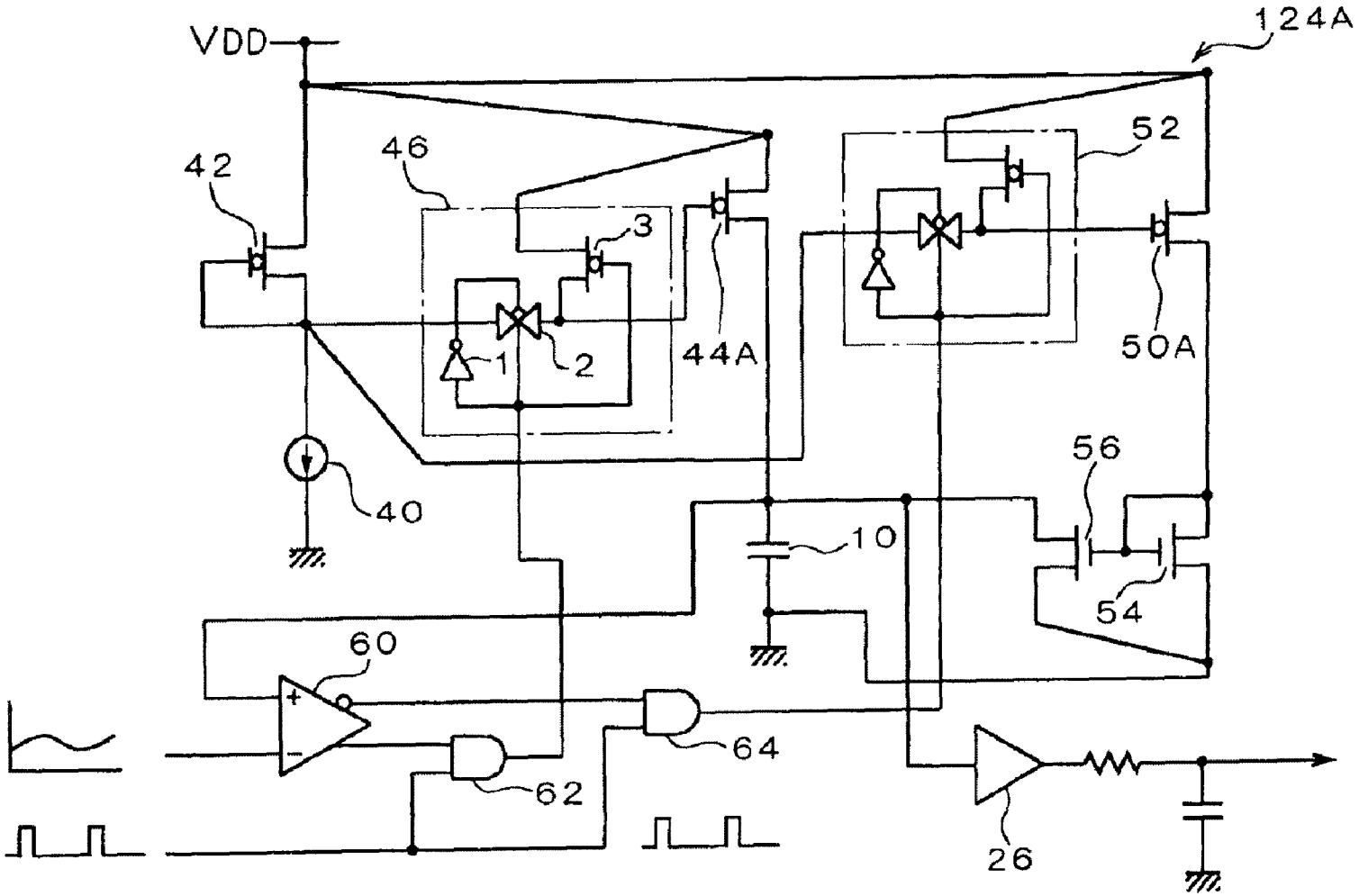
FIG. 6 is a circuit diagram showing an example of a modification of the smoothing circuit.

FIG. 6 is a circuit diagram showing an example of a modification of the smoothing circuit. A smoothing circuit 124A shown in FIG. 6 differs from the smoothing circuit 124 shown in FIG. 5 in that the frequency divider 70 is removed and the two transistors 44 and 50 are replaced with two transistors 44A and 50A having the gate sizes changed.

Figure 7:
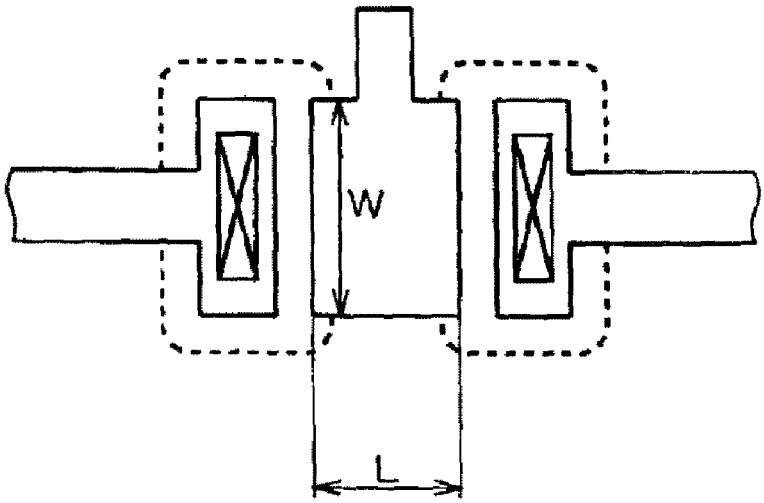
FIG. 7 is a diagram showing the gate size of a MOS transistor.
Figure 8:
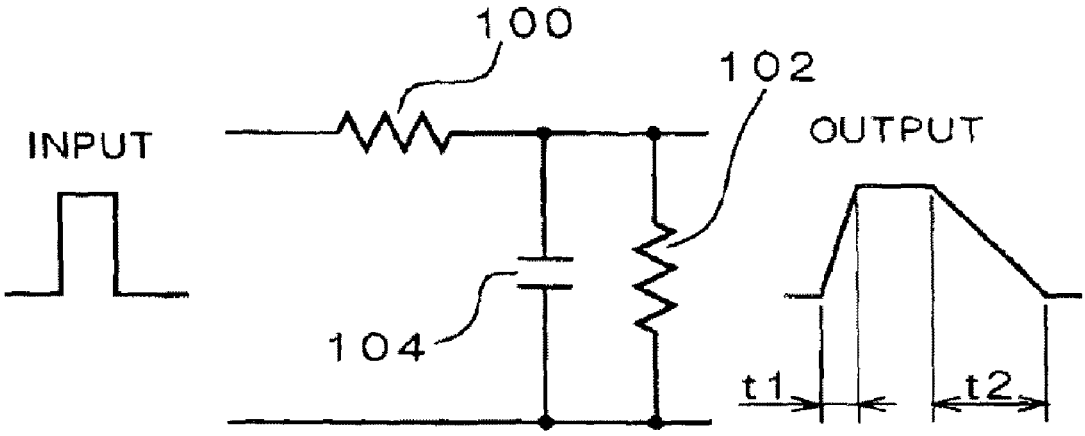
FIG. 8 is a circuit diagram showing the configuration of a conventional smoothing circuit.

FIG. 7 is a diagram showing the gate size of a MOS transistor (FET). Even when the gate voltage is fixed, the channel resistance can be changed by selecting the gate width W and the gate length L to change the current flowing through the path between the source and the drain. In this example of modification, in order to shorten the attack time by increasing the charging current, the gate width W of the transistor 44A is set to a larger value and the gate length L is set to a smaller value. On the other hand, in order to increase the release time by reducing the discharging current, the gate width W of the transistor 50A is set to a smaller value and the gate length L is set to a larger value. Thus, it is also possible to easily set different lengths of time as attack time and release time by changing the gate size of each of the transistors 44A and 50A. In this case, the transistors 44A and 50A constitute portions of the charging circuit 14 and the discharging circuit 16 and function as the charging/discharging speed setting unit.

INDUSTRIAL APPLICABILITY

According to the present invention, as described above, the capacitor is intermittently charged and discharged, so that the terminal voltage of the capacitor changes gradually and an equivalently large time constant can be set even if the electrostatic capacity of the capacitor is reduced. Therefore, even in the case of setting a large time constant, a smaller capacitor can be used and the size of the circuit can be reduced. The need for a large resistor and a large capacitor necessary for setting a large time constant is eliminated to make it possible to reduce or completely remove externally mounted component parts. Therefore, the entire smoothing circuit or almost all the components parts can be formed in an IC. Further, the charging/discharging speed setting unit is provided to set the speeds of charging and discharging of the capacitor to different values. It is, therefore, possible to realize a smoothing circuit in which different lengths of time can easily set as attack time and release time.

What is claimed is:

1. A smoothing circuit comprising:

a capacitor;

a voltage comparator which compares a terminal voltage of said capacitor and an input voltage;

a charging circuit which intermittently charges said capacitor when said input voltage is higher relatively than said terminal voltage; and a discharging circuit which intermittently releases a discharging current from said capacitor when said terminal voltage is [lower] *higher* relatively than said input voltage, wherein said charging circuit comprises a current supply section which supplies a predetermined charging current to said capacitor, and a first timing control section which controls the timing of the operation to intermittently supply the charging current by said current supply section.

2. The smoothing circuit according claim 1 wherein said first timing control section has a switch for performing said timing control on the basis of a pulse signal having a predetermined duty ratio.

3. The smoothing circuit according to claim 2 wherein the frequency of said pulse signal is higher than twice the frequency of the input signal.

4. The smoothing circuit according to claim 1 wherein said current supply section comprises a constant-current circuit and a current mirror circuit which supplies said capacitor with the charging current equal to the current generated by said constant-current circuit.

5. A smoothing circuit comprising:

a capacitor;

a voltage comparator which compares a terminal voltage of said capacitor and an input voltage;

a charging circuit which intermittently charges said capacitor when said input voltage is higher relatively than said terminal voltage; and a discharging circuit which intermittently releases a discharging current from said capacitor when said terminal voltage is [lower] *higher* relatively than said input voltage, wherein said discharging circuit comprises a current release section which releases the predetermined discharging current from said capacitor, and a second timing control section which controls the timing of the operation to intermittently release the discharging current by said current release section.

6. The smoothing circuit according to claim 5 wherein said second timing control section has a switch for performing said timing control on the basis of a pulse signal having a predetermined duty ratio.

7. The smoothing circuit according to claim 6 wherein the frequency of said pulse signal is higher than twice the frequency of the input signal.

8. The smoothing circuit according to claim 5 wherein said current release section comprises a constant-current circuit and a current mirror circuit which releases from said capacitor the discharging current equal to the current generated by said constant-current circuit.

9. A smoothing circuit comprising:

a capacitor;

a voltage comparator which compares a terminal voltage of said capacitor and an input voltages;

a charging circuit which intermittently charges said capacitor when said input voltage is higher relatively than said terminal voltage; and a discharging circuit which intermittently releases a discharging current from said capacitor when said terminal voltage is [lower] *higher* relatively than said input voltage, wherein said charging circuit comprises a current supply section which supplies a predetermined charging current to said capacitor, and a first timing control section which controls the timing of the operation to intermittently supply the charging current by said current supply section;

said discharging circuit comprises a current release section which releases the predetermined discharging current from said capacitor, and a second timing control section which controls the timing of the operation to intermittently release the discharging current by said current release section; and the timing of supply of the charging current controlled by said first timing control section and the timing of discharging by the discharging current controlled by said second timing control section do not overlap each other.

[10. A smoothing circuit comprising:

a capacitor;

a voltage comparator which compares a terminal voltage of said capacitor and an input voltage;

a charging circuit which intermittently charges said capacitor when said input voltage is higher relatively than said terminal voltage; and a discharging circuit which intermittently releases a discharging current from said capacitor when said terminal voltage is lower relatively than said input voltage, further comprising charging/discharging speed setting unit for setting the speed of charging by said charging circuit and the speed of discharging by said discharging circuit to different values.]

11. [The smoothing circuit according to claim 10] *A smoothing circuit comprising:*

*a capacitor;*

*a voltage comparator which compares a terminal voltage of said capacitor and an input voltage;*

*a charging circuit which intermittently charges said capacitor when said input voltage is higher relatively than said terminal voltage; and*

*a discharging circuit which intermittently releases a discharging current from said capacitor when said terminal voltage is higher relatively than said input voltage,*

*further comprising charging/discharging speed setting unit for setting the speed of charging by said charging circuit and the speed of discharging by said discharging circuit to different values,* wherein said charging circuit comprises a current supply section which supplies a predetermined charging current to said capacitor, and a first timing control section which controls the timing of the operation to intermittently supply the charging current by said current supply section;

said discharging circuit comprises a current release section which releases the predetermined discharging current from said capacitor, and a second timing control section which controls the timing of the operation to intermittently release the discharging current by said current release section; and said charging/discharging speed setting unit sets different lengths of time as the time period for intermittent supply of the charging current controlled by said first timing control section and the time period for intermittent release of the discharging current controlled by said second timing control section.

12. The smoothing circuit according to claim 11, wherein said first and second timing control sections each have a switch for performing said timing control on the basis of a pulse signal having a predetermined duty ratio; and wherein said charging/discharging speed setting unit sets the duty ratio of said pulse signal for charging and the duty ration of said pulse signal for discharging to different values.

13. The smoothing circuit according to claim 11, wherein said charging/discharging speed setting unit sets the charging current supplied by said current supply section and the discharging current released by said current release section to different values.

14. The smoothing circuit according to claim 13, wherein each of said current supply section and said current release section is constituted by a transistor having a predetermined reference voltage applied to its gate; and said charging/discharging speed setting unit makes the gate size of said transistor for charging and the gate size of said transistor for discharging different from each other.

15. The smoothing circuit according to claim 12, wherein the frequency of said pulse signal is higher than twice the frequency of the input signal.

* * * * *